United States Patent [19]
Chiba et al.

[11] Patent Number: 6,005,774
[45] Date of Patent: *Dec. 21, 1999

[54] INTEGRATED CIRCUIT CARD

[75] Inventors: Kazuo Chiba, Kawasaki; Masakatsu Ozawa, Ebina; Kenichi Imamura, Yokohama, all of Japan

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/929,185

[22] Filed: Sep. 8, 1997

Related U.S. Application Data

[63] Continuation of application No. 08/558,630, Nov. 14, 1995, abandoned.

[30] Foreign Application Priority Data

Dec. 9, 1994 [JP] Japan .................................. 6-306514

[51] Int. Cl.⁶ .............................. H05K 1/14; H01R 23/02
[52] U.S. Cl. .......................... 361/737; 439/676; 439/144; 439/946
[58] Field of Search ..................................... 361/737, 752, 361/796, 754–756, 684–686, 724–727; 439/144, 946, 131, 676

[56] References Cited

U.S. PATENT DOCUMENTS

| | | | |
|---|---|---|---|
| 5,338,210 | 8/1994 | Beckham et al. | 439/131 |
| 5,562,504 | 10/1996 | Moshayedi | 439/638 |
| 5,679,013 | 10/1997 | Matsunaga et al. | 439/144 |

*Primary Examiner*—Leo P. Picard
*Assistant Examiner*—Jayprakash N. Gandhi
*Attorney, Agent, or Firm*—Anthony N. Magistrale; Jack V. Musgrove; Andrew J. Dillon

[57] ABSTRACT

Disclosed is an IC card having a connector wherein a socket or a jack can be inserted in a direction that is parallel to the face of the IC card. The connector includes a connector body having a rotatable housing attached thereto. The housing has an opening by which a socket or a jack can be fitted and secured to the connector body. When a socket or a jack is not connected to the IC card, the housing member can lie level along the face of the IC card but when a socket is to be connected, the housing can be raised such that it is almost perpendicular to the face of the IC card. The socket or the jack can therefore be inserted parallel to the face of the IC card.

8 Claims, 5 Drawing Sheets

INTEGRATED CIRCUIT CARD

This is a continuation of application Ser. No. 08/558,630, filed Nov. 14, 1995, now abandoned.

BACKGROUND OF THE INVENTION

1. Field of the Invention

The present invention relates to a computer integrated circuit (IC) card, such as a PCMCIA card, and in particular to an IC card connector which allows a socket or a jack to be inserted such that it is positioned parallel to a face of the IC card.

2. Description of Related Art

Conventionally, a personal computer has a plurality of integrated circuits (ICs) or large scale integrated circuits (LSIs) mounted in it for connection to external devices, (e.g., photomagnetic disk drives, CD-ROM drives, or token ring networks) and also includes a printed circuit board with a dedicated connector that is attached to the body of a computer.

A printed circuit board on which a discreet IC or LSI is mounted can no longer be attached to an A4-sized notebook or an A5-sized sub-notebook portable computer, such as, for example, a ThinkPad (a product of International Business Machines Corporation) because the size of the computer case is limited.

The Personal Computer Memory Card International Association (PCMCIA) for the standardization of personal computer IC cards, such as memory cards, was established in the United States in 1989, and determined the standards for personal computer IC cards. Accordingly, an IC card that conforms to the standards is called a PCMCIA card.

Since the size of a PCMCIA card is standardized, and since various integrated circuits are packaged on this card which is almost the equivalent in size of a business card, many recent portable computers include a slot for such a PCMCIA card. However, a disadvantage of such PCMCIA cards is that it is difficult to attach a connector for an external device to the PCMCIA card because it is extremely thin, about 3 to 10 mm.

One technique which has been proposed to resolve this shortcoming is shown in FIG. 1 and involves the use of an intermediate conversion cable 106 to connect a PCMCIA card 102 to an external socket 104. A disadvantage of this structure, however, is that an attachment portion 108 of the PCMCIA card 102 can be easily damaged when the conversion cable 106 is pulled.

U.S. Pat. No. 5,385,479 discloses a structure of a modular jack connector that is composed of a flat plate member which extends from one end to the other and parallel to the face of an IC card, wherein is formed at one end a hole having a freely opened and closed cover that, when open, permits the insertion of a modular jack so that the jack is positioned perpendicular to the face of the IC card.

Since U.S. Pat. No. 5,385,479 discloses that a modular jack must be inserted such that it is perpendicular to the face of the IC card, when another PCMCIA card is inserted adjacent to that card, it is possible that the modular jack will abut upon the newly inserted PCMCIA card, thereby making it difficult to insert the modular jack or preventing the PCMCIA card from being coupled with a connector.

SUMMARY OF THE INVENTION

The present invention is directed to an IC card which includes a flat plate member to which a rotatable housing is so attached that when the IC card is disconnected from a socket the flat plate member and the rotatable housing are level with the face of the IC card, and when a socket or a jack is to be connected, the rotatable housing can be shifted so that it is almost perpendicular to the face of the IC card. Further, an opening into which the socket or the jack can be fitted is provided within the housing.

With the above structure, a socket or a jack can be inserted such that it is positioned parallel to the face of the IC card, and even when the IC card is located adjacent to it, interference with that IC card will be minimal.

In addition, in accordance with another embodiment of the present invention, the portion of the flat plate member that can be positioned upright can be rotated to either side of the flat plate member so that the portion can be shifted to the side where it is most convenient.

DETAILED DESCRIPTION OF THE INVENTION

The present invention will now be described while referring to the accompanying drawings.

Figure 1:
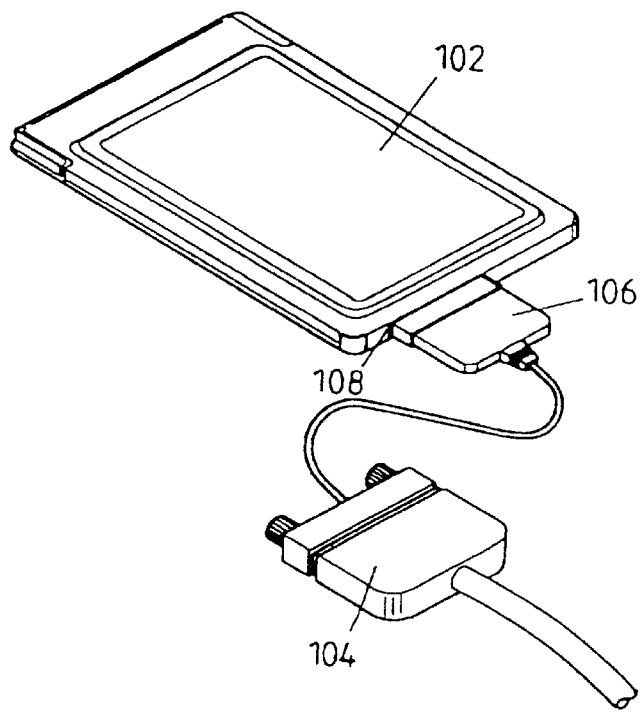
FIG. 1 is a perspective view of a prior art connector for an IC card.
Figure 2:
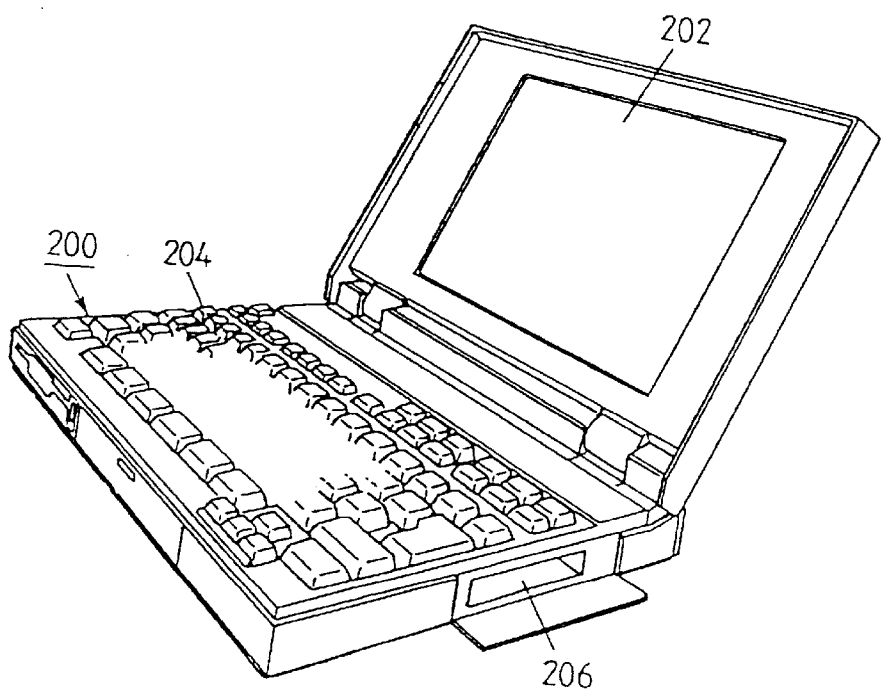
FIG. 2 is a perspective view of a portable computer that has a slot for an IC card.

FIG. 2 is a perspective view of a portable or laptop computer 200. The portable computer 200 includes a color liquid crystal panel screen 202 and a keyboard 204. A slot 206 into which a PCMCIA card can be inserted is provided in the right side of the computer 200.

Figure 3:
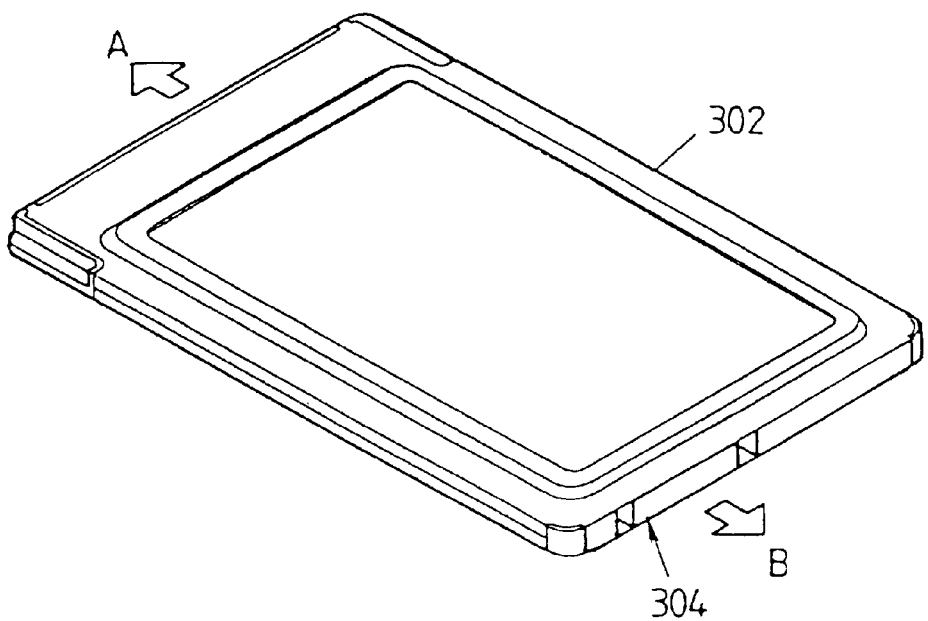
FIG. 3 is a perspective view of an IC card according to the present invention when the connector is disposed within the card.
Figure 4:
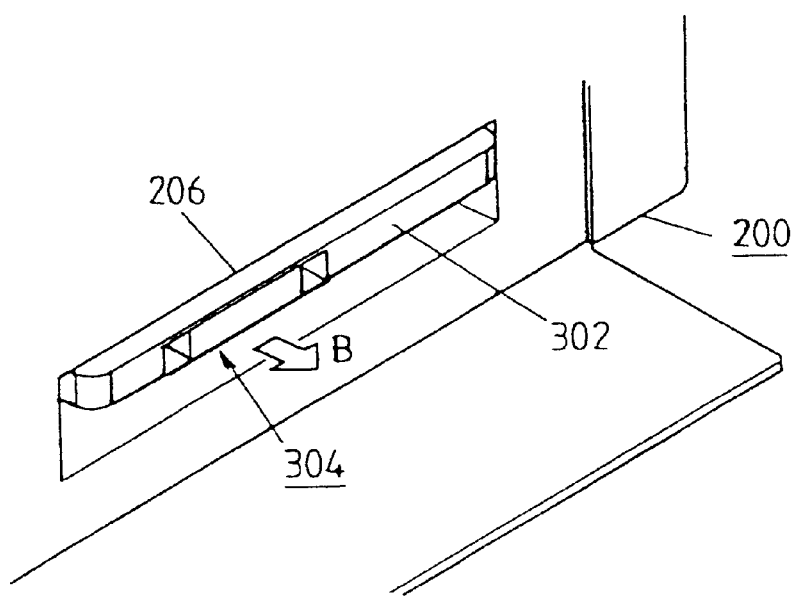
FIG. 4 is a perspective view illustrating when the IC card of FIG. 3 has been inserted into the slot of a portable computer.

In FIG. 3 there is shown a PCMCIA card 302 that has a connector 304 according to the present invention. The connector 304 can be employed to connect an external device to the card 302 via a socket or jack. As an illustrative example, the connector 304 can be used to connect a telephone to card 302 via a modular jack. The PCMCIA card 302 can function as, for example, a modem for the portable computer 200. The PCMCIA card 302 can be inserted into the slot 206 in the direction indicated by the arrow A. In one state of the connector 304, as shown in FIGS. 3 and 4, the connector 304 is disposed within the body of the PCMCIA card 302.

The connector 304 is loaded using a push-pop mechanism. By pressing inward in the direction that is the opposite of that indicated by the arrow B in FIGS. 3 and 4, the connector 304 can projected outward from the PCMCIA card 302 in the direction that is indicated by the arrow B in FIGS. 3 and 4.

Figure 5:
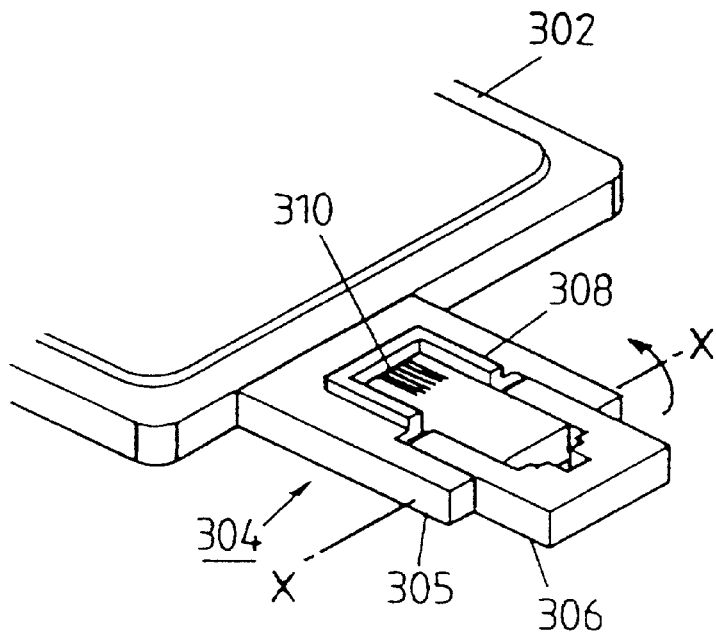
FIG. 5 is a perspective view of the IC card according to the present invention when the connector has been pulled out of the IC card.

FIG. 5 illustrates a state when the connector 304 has been projected outward in the above described manner. The connector 304 includes a connector body 305, which can be shifted parallel to the face of the card 302, and an inverted U-shaped housing 306, which is supported at the connector body 305 so as to be rotatable around an imaginary axis indicated by X—X. The connector body 305 and the housing 306 are both made of insulating plastic. The connector body 305 further includes a convex rib 308, which abuts upon the front face of an inserted modular jack to guide and secure it. The connector body 305 also includes a plurality of conductive terminals 310 which are contacted by and electrically connected to the terminals of the modular jack when the modular jack is inserted and is in contact with the rib 308.

To place the connector 304 back inside the card 302, the housing 306 is rotated downward to the original position shown in FIG. 5. Next, the connector 304 is pushed inside the card 302 as shown in FIG. 4. The connector 304 is then held within the body of the card 302 by the aforementioned push-pop mechanism, as shown in FIG. 4. In this manner, it is possible to prevent the connector 304 from being damaged by, for example, its striking a desk or a chair while the portable computer 200 is being carried.

Figure 6:
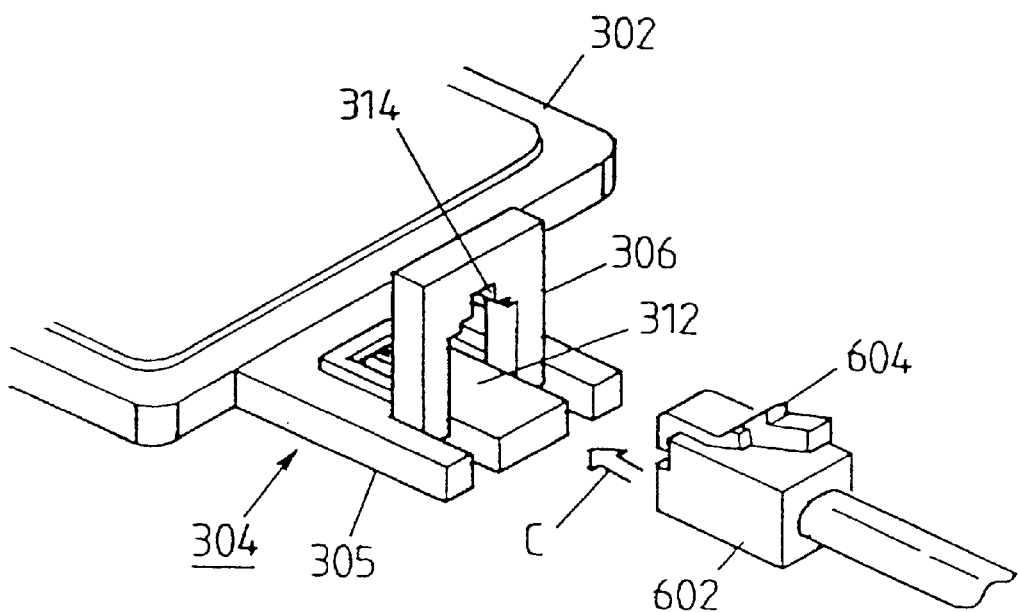
FIG. 6 is a perspective view of the IC card of FIG. 5 showing when the connector housing has been raised until it is almost perpendicular.

Turning now to FIG. 6, the IC card of the present invention is shown wherein the housing 306 has been rotated upward and around the axis X—X with a user's fingers until it is perpendicular or substantially perpendicular to the top face of the PCMCIA card 302. Since the housing 306 is formed such that it has an inverted U shape, the housing 306 forms an opening 312 while it is upright. A recessed portion 314 is formed in the upper end of the opening 312 to engage a latch 604 of a modular jack 602.

Figure 7:
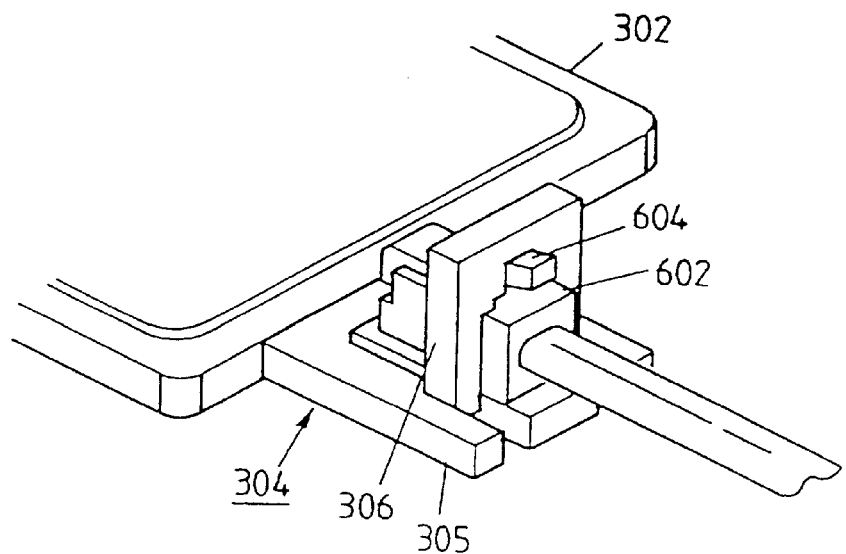
FIG. 7 is a perspective view showing when a modular jack has been inserted into the connector housing of the IC card of FIG. 6.
Figure 8:
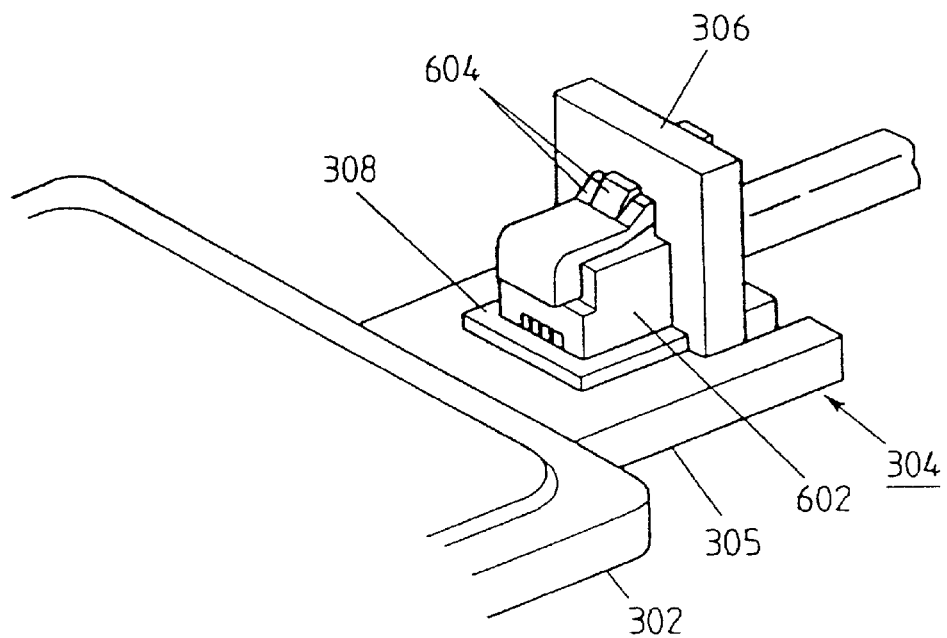
FIG. 8 is a perspective view of the IC card of FIG. 7 from an opposite side of the connector housing.

When the modular jack 602 is moved in the direction that is indicated by the arrow C (FIG. 6) and is inserted into the opening 312 of the housing 306, as is shown in FIG. 7, the front end of the modular jack 602 abuts upon the rib 308 and the latch 604 is fitted into the recessed portion 314 such that the modular jack 602 is fixedly retained in the connector 304. FIG. 8 is a view of the IC card and modular jack of FIG. 7 viewed from a different direction. To remove the modular jack 602, it need only be pulled in the direction that is the opposite of that indicated by the arrow C in FIG. 6 while the latch 604 is depressed.

Figure 9:
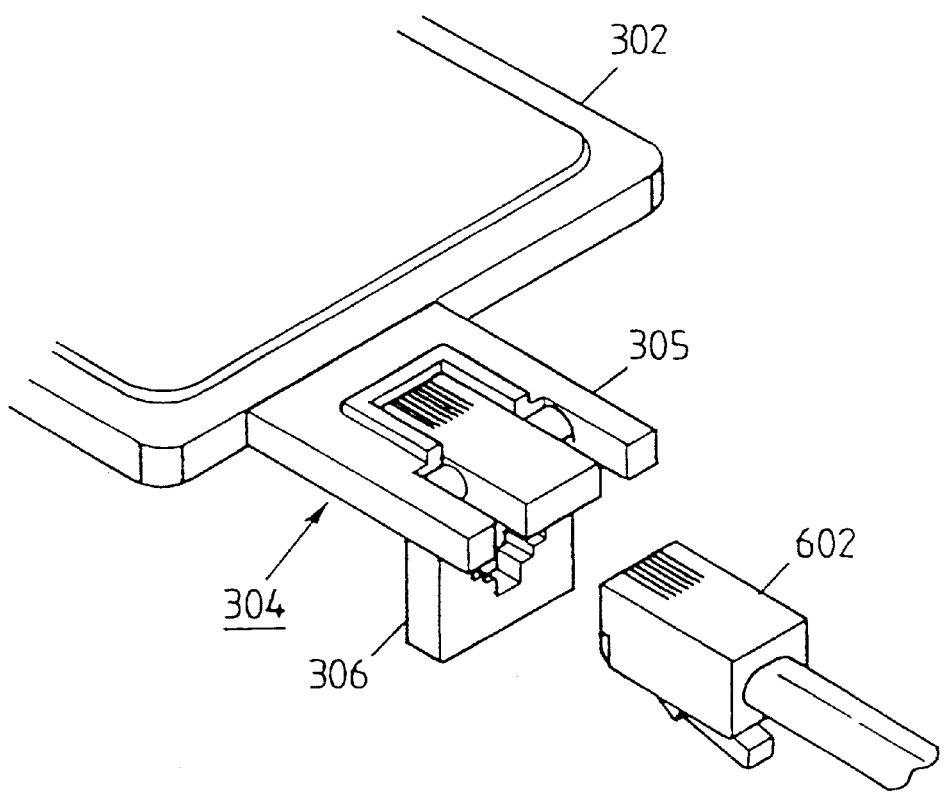
FIG. 9 is a perspective view of an IC card according to another embodiment of the present invention wherein a connector housing can be rotated downward until it is almost perpendicular.

In accordance with another embodiment of the present invention, a rib 308 and terminals 310 can be formed on the reverse side (not shown) of the connector 304 in the same manner as is shown in FIG. 5. In this embodiment, the housing 306 can be rotated downward until it is almost perpendicular to the bottom face of the PCMCIA card 302 as shown in FIG. 9. In FIG. 9, the modular jack 602 is upside down when it is inserted into the connector 304.

As described above, according to the present invention, a rotatable housing is provided as an IC card connector that can be raised until it is substantially perpendicular to the face of the IC card, and an opening is formed in the housing into which a socket (a jack) can be fitted. Thus, the socket can be inserted in a direction that is substantially parallel to the face of the IC card, and even when there is an adjacently located IC card, interference with that card will be minimal.

According to another embodiment of the present invention, as described above, the housing can be rotated to either side, and a user can therefore rotate the housing to the side that is the most convenient to use.

Although the present invention has been described with regard to employing a modular jack as an example device that is fitted into the connector 304, the connector 304 used in the present invention can be applied or formed to correspond any socket, jack, or plug that is intended to be fitted into an opening.

While the invention has been particularly shown and described with respect to preferred embodiments thereof, it should be understood by those skilled in the art that the foregoing and other changes in form and detail may be made therein without departing from the spirit and scope of the invention as defined in the appended claims.

What is claimed is:

1. An integrated circuit card comprising:
    (a) a substantially flat plate IC card body;
    (b) a connector body that extends from one end of said IC card body such that it is almost parallel to a flat face of said IC card body, said connector body having a central portion with a substantially flat surface, and having a rib formed on said central portion;
    (c) a single rotary member formed to wholly receive a jack, said single rotary member being supported by said connector body and pivoting along an axis passing through said central portion of said connector body so as to be rotatable to (1) a first position which is parallel to said flat face of said IC card body, to (2) a second position which is perpendicular to said flat face and wherein said jack can be accepted at said second position overlying said flat surface of said central portion of said connector body and in a direction that is parallel to said flat face of said IC card body, and (3) a third position which, with said first position serving as a reference position, is at a side opposite to a side to which said single rotary member is rotated for said second position, wherein said single rotary member is positioned perpendicular to said flat face of said IC card body, said rib being positioned along said central portion of said connector body to guide and secure said jack when said jack is fully inserted in said single rotary member and in contact with said rib; and
    (d) a terminal which is integral to said connector body and formed on said flat surface of said central portion thereof, proximate said rib, and can form an electric contact with a mated terminal of said jack when said jack is retained in said single rotary member.

2. The IC card according to claim 1, wherein said connector body and said single rotary member are formed of an electric insulation material.

3. The IC card according to claim 1, wherein said single rotary member is so formed as to have an almost inverted U shape.

4. The IC card according to claim 1, wherein said connector body is a retractable connector body which can be (1) retracted to a first position wherein said connector body is disposed within said IC card body and said single rotary member is in said first position and (2) extended to a second position wherein said connector body is disposed outside of said IC card body and extends from one end of said IC card, said single rotary member being in said first or said second position when said connector body is in said second position.

5. The IC card according to claim 1, wherein said connector body is so supported as to be capable of being loaded into and unloaded from said IC card body.

6. The IC card according to claim 1, wherein said jack is a modular jack for a telephone.

7. The IC card according to claim 1, wherein a recessed portion is formed in said opening of said single rotary member to engage a latch of said modular jack.

8. An integrated circuit card comprising:
  (a) a flat plate IC card body;
  (b) a connector body that extends from one end of said IC card body such that it is parallel to a flat face of said IC card body;
  (c) a rotary member having an opening for receiving a jack, said rotary member being supported by said connector body so as to be rotatable to (1) a first position which is parallel to said flat face of said IC card body, to (2) a second position which is perpendicular to said flat face and wherein said jack can be accepted at said second position in a direction that is parallel to said flat face of said IC card body, and to (3) a third position which, with said first position serving as a reference position, is at a side opposite to a side to which said single rotary member is rotated for said second position, wherein said single rotary member is positioned perpendicular to said flat face of said IC card body; and
  (d) a terminal which is integral to said connector body and can form an electric contact with a mated terminal of said jack when said jack is retained in said rotary member.

* * * * *